United States Patent [19]
Lee et al.

[11] Patent Number: 6,099,700
[45] Date of Patent: Aug. 8, 2000

[54] SURFACE ACOUSTIC WAVE FILTER EMPLOYING A1N/A1N:H/A1N TRI-LAYERED FILM AND A PROCESS FOR FABRICATING THE SAME

[75] Inventors: Jai-Young Lee; Yoon-Kee Kim; Yoon-Jung Yong; Young-Soo Han, all of Taejon, Rep. of Korea

[73] Assignee: Korea Advanced Institute of Science and Technology, Taejon, Rep. of Korea

[21] Appl. No.: 08/999,022

[22] Filed: Dec. 29, 1997

[30] Foreign Application Priority Data

Dec. 30, 1996 [KR] Rep. of Korea ................. 96-76809

[51] Int. Cl.[7] .................. C23C 14/32; B05D 5/12
[52] U.S. Cl. ................ 204/192.18; 204/192.15; 427/100
[58] Field of Search .................. 427/100, 405, 427/419.7; 204/192.15, 192.18; 310/313 R, 322, 334, 313 A

[56] References Cited

U.S. PATENT DOCUMENTS

| | | | |
|---|---|---|---|
| 4,236,095 | 11/1980 | Ono et al. | 310/313 A |
| 4,567,393 | 1/1986 | Asai et al. | 310/313 A |
| 4,571,519 | 2/1986 | Kawabata et al. | 310/313 A |
| 4,749,900 | 6/1988 | Hadimioglu et al. | 427/100 |
| 5,936,329 | 8/1999 | Shibata et al. | 310/313 R |

OTHER PUBLICATIONS

H. Okano et al., "Characteristics of AIN Thin Films Deposited by Electron Cyclotron Resonance Dual–Ion–Beam Sputtering and Their Application to GHz–Bank Surface Acoustic Wave Devices", Jpn. J. Appl. Phys., 33:2957–2961, No Month Available (1994).

H. Nakahata et al., "Theoretical Study on SAW Characteristics of Layered Structures Including a Diamond Layer", IEEE Trans. Ultrason. Ferroelect. Frequen. Control, 42:362–375, No Month Available (1995).

S. Takeda, "Relation Between Optical Property and Crystallinity of ZnO Thin Films Prepared by rf Magnetron Sputtering", J. Appl. Phys., 73:4739–4742, No Month Available (1993).

K. Tsubouchi and N. Mikoshiba, "Zero–Temperature–Coefficient SAW Devices on AIN Epitaxial Films", IEEE Trans. Sonics Ultrason., SU–32:634–644, No Month Available (1985).

*Primary Examiner*—Brian K. Talbot
*Attorney, Agent, or Firm*—Darby & Darby

[57] ABSTRACT

The present invention provides a novel surface acoustic wave (SAW) filter having a high propagation velocity and electromechanical coupling coefficient ($k^2$) employing A1N/A1N:H/A1N tri-layered film where both sides of A1N:H film are deposited with A1N film to protect the film from vapor, and a process for fabricating the same.

4 Claims, 6 Drawing Sheets

SURFACE ACOUSTIC WAVE FILTER EMPLOYING AlN/AlN:H/AlN TRI-LAYERED FILM AND A PROCESS FOR FABRICATING THE SAME

FIELD OF THE INVENTION

The present invention relates to a novel surface acoustic wave(SAW) filter employing aluminum nitride (AlN) film and a process for fabricating the same, more specifically, to a surface acoustic wave filter having a high propagation velocity and electromechanical coupling coefficient($k^2$) employing AlN/AlN:H/AlN tri-layered film where both sides of AlN:H film are deposited with AlN film to protect the film from vapor, and a process for fabricating the same.

BACKGROUND OF THE INVENTION

In general, a surface acoustic wave("SAW") filter employing a piezo-electric material, to be used as a filter in high frequency band of more than 100 MHz, should have a high propagation velocity and electromechanical coupling coefficient, and the cost of piezo-electric material should be sufficiently low. However, the conventional piezo-electric material such as $LiNbO_3$, has been proven to be less satisfactory in the senses that it is relatively expensive and is a single crystal structure with large volume. Aluminum nitride("AlN") film, an alternative piezo-electric material currently used, can be easily and inexpensively fabricated according to the sputtering methods conventional in the art. AlN film has been reported to have a SAW propagation velocity of above 5,000 m/s(see: H. Okano et al., Jpn. J. Appl. Phys., 33:2957(1994)). However, since the AlN film has been also known to have a low electromechanical coupling coefficient of below 0.8%(see: K. Tsubouchi and N. Mikoshiba, IEEE Trans. Sonics Ultrason., SU-32:634 (1985)), there has been a continuous need for the piezo-electric AlN film having a high electromechanical coupling coefficient value.

On the other hand, Wang et al. suggested that, if 25% of nitrogen is replaced with hydrogen gas on deposition of AlN film, the rough surface becomes have a smoothness of about 0.3 nm, and the adhesiveness is improved due to the decrease of stress inside of the film(see: X.-D. Wang et al., Thin Solid Films, 251:121(1994); X.-D. Wang et al., Langmuir, 8:1347(1992)). Despite the improvement of the smoothness and the adhesiveness of AlN:H film containing hydrogen, there is still a problem of blistering phenonmenon that the chemical nature of the film is changed by the vapor of the atmosphere and peeled off.

Accordingly, there are strong reasons for exploring and developing alternative means for fabricating a surface acoustic wave filter having a high SAW propagation velocity and electromechanical coupling coefficient, while overcoming the blistering problem of the AlN:H film.

SUMMARY OF THE INVENTION

In this regard, the present inventors developed a surface acoustic wave(SAW) filter having a high SAW propagation velocity and electromechanical coupling coefficient by employing AlN/AlN:H/AlN tri-layered film, while overcoming the blistering problem by increasing the added amount of hydrogen, based on a knowledge that AlN:H film shows a smooth surface and a decreased suppression stress, as the added amount of hydrogen gas increases.

A primary object of the present invention is, therefore, to provide a SAW filter having a high SAW propagation velocity and electromechanical coupling coefficient.

The other object of the invention is to provide a process for fabricating the SAW filter by employing AlN/AlN:H/AlN tri-layered film.

BRIEF DESCRIPTION OF DRAWINGS

The above and the other objects and features of the present invention will become apparent from the following description given in conjunction with the accompanying drawings, in which.

DETAILED DESCRIPTION OF THE INVENTION

The present inventors noticed that, when AlN:H film was fabricated by the addition of hydrogen gas to a reaction gas, preferably in a ratio of 5% (v/v) to 30% (v/v), in the course of AlN film deposition according to a RF Magnetron Sputtering method, the film showed a smooth surface and a decreased suppression stress as the added amount of hydrogen gas increased. However, the chemical composition of the fabricated AlN:H film was changed by the atmospheric vapor, which caused the blistering phenomenon at the interface of film and substrate.

To cure the said blistering phenomenon, both sides of the AlN:H film were deposited with AlN film to have a thickness of 100 to 10,000 Å, more preferably 500 to 5,000 Å to provide AlN/AlN:H/AlN tri-layered film. The AlN tri-layered film did not show the blistering phenomenon and showed more decreased suppression stress than AlN mono-layered film deposited under an environment of a reaction gas containing the same amount of hydrogen, which demonstrates that it has a superior adhesiveness.

A SAW filter was fabricated by employing the AlN/AlN:H/AlN tri-layered film as a piezo-electric material, whose SAW propagation velocity and electromechanical coupling coefficient are much higher than those of AlN mono-layer or AlN:H mono-layer film.

Accordingly, it was demonstrated that the present invention provides a simple process for fabricating a SAW filter having a high SAW propagation velocity and electromechanical coupling coefficient.

The present invention is further illustrated by the following examples, which should not be taken to limit the scope of the invention.

EXAMPLE 1: Fabrication of AlN:H film

AlN:H film was fabricated according to the reactive sputtering method known in the art(see: H. C. Lee et al., Thin Solid Films, 271:50–55(1995)), by employing a reactive RF Magnetron Sputtering system which comprises a vacuum apparatus, a sputtering target, a substrate supporter and a gas injector. In the course of fabricating the AlN:H film, a p-type(100) silicon washed with fluoric acid was employed as a substrate and argon, nitrogen and hydrogen with more than 99.9999% of purity were used for the deposition of aluminum with more than 99.999% of purity. The initial degree of vacuum was below $5\times10^{-7}$ Torr. And, the deposition was performed by the aid of a RF power supply of 250 W, under a room temperature, pressure of 8 mTorr, 6 sccm of argon and nitrogen flow rate, reactive gas containing 5 to 20% (v/v) of hydrogen.

FIGS. 1(A), 1(B), 1(C) and 1(D) are SEM micrographs showing smoothness of the surfaces of AlN films deposited when the amount of hydrogen gas contained in reaction gas is 0% (v/v), 5% (v/v), 10% (v/v) and 20% (v/v), respectively. As shown in FIGS. 1(A) to 1(D), the surface of AlN film becomes smoother as the added amount of hydrogen increases.

Figure 1A:
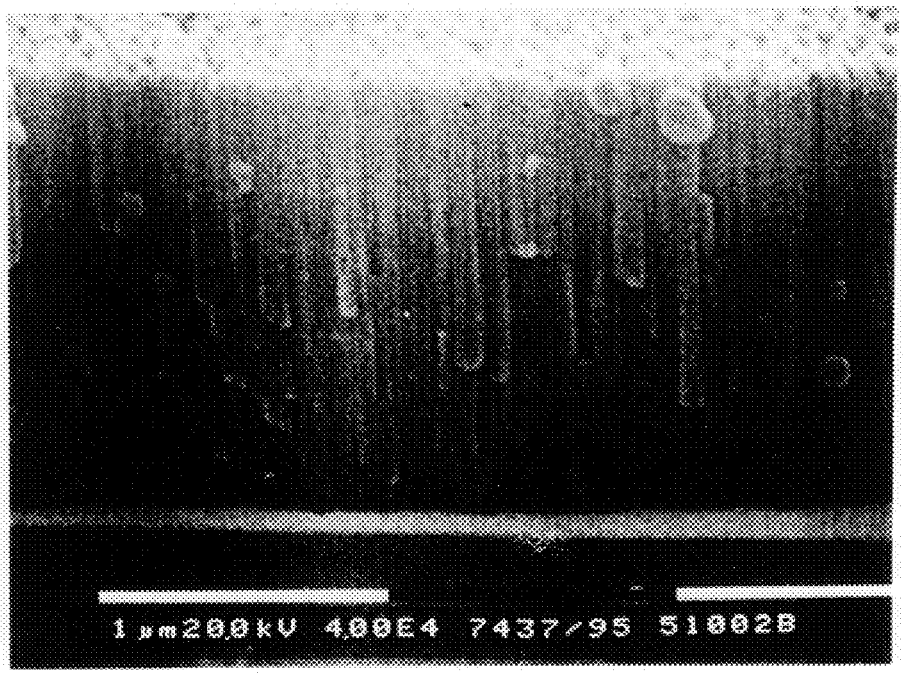
FIGS. 1(A), 1(B), 1(C) and 1(D) are SEM micrographs showing smoothness of the surfaces of deposited AlN films when the amount of hydrogen gas contained in a reaction gas is 0% (v/v), 5% (v/v), 10% (v/v) and 20% (v/v), respectively.
Figure 1B:
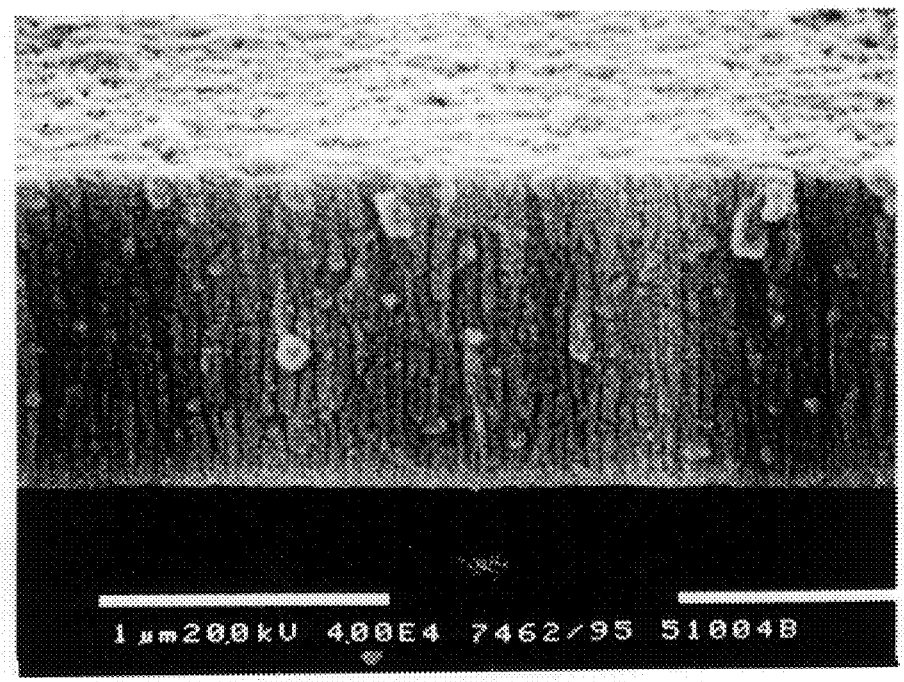
Figure 1C:
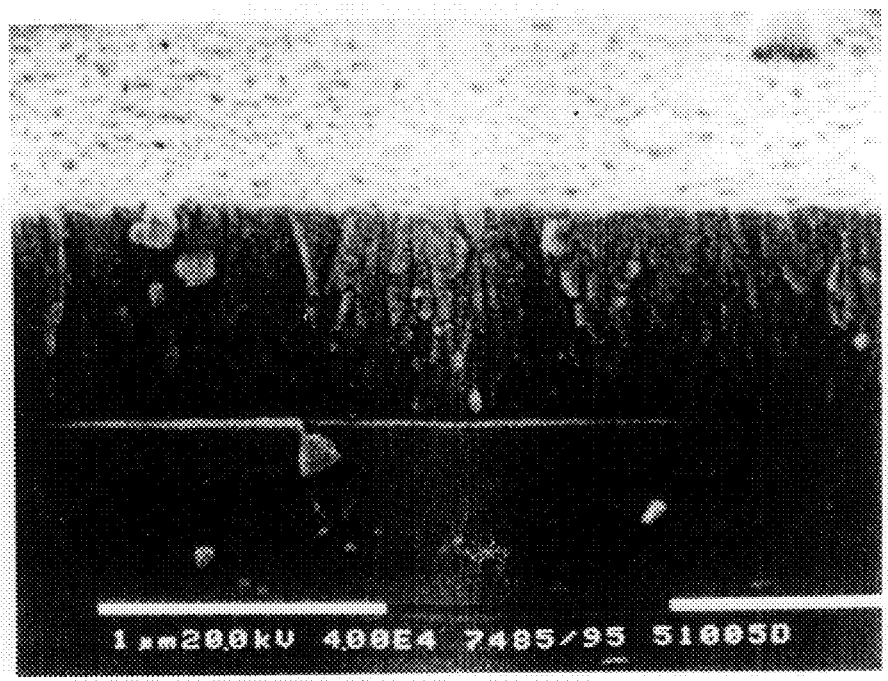
Figure 1D:
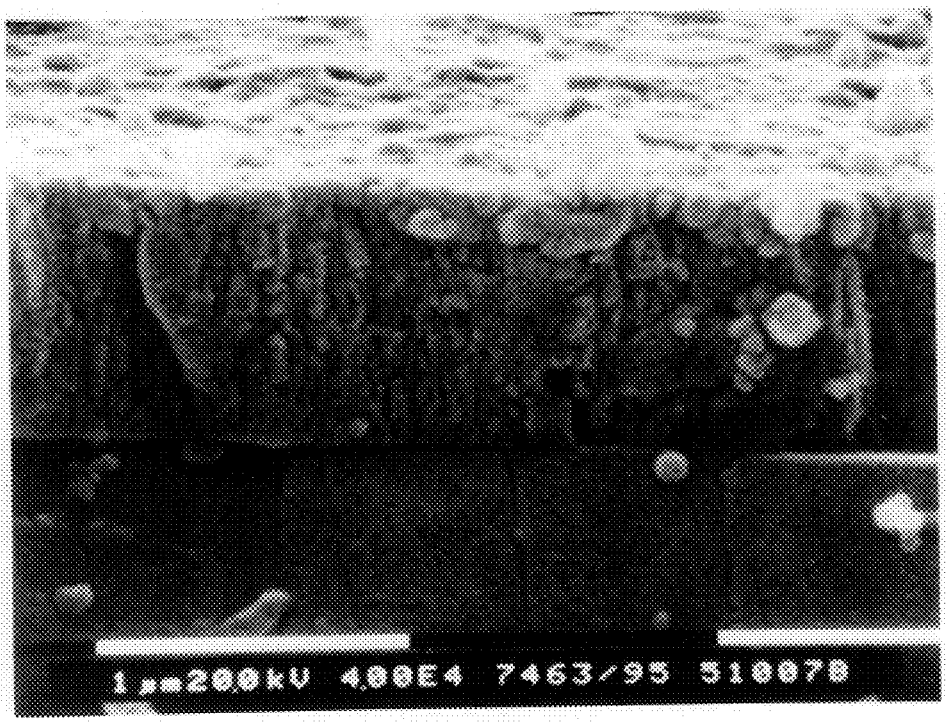
Figure 2:
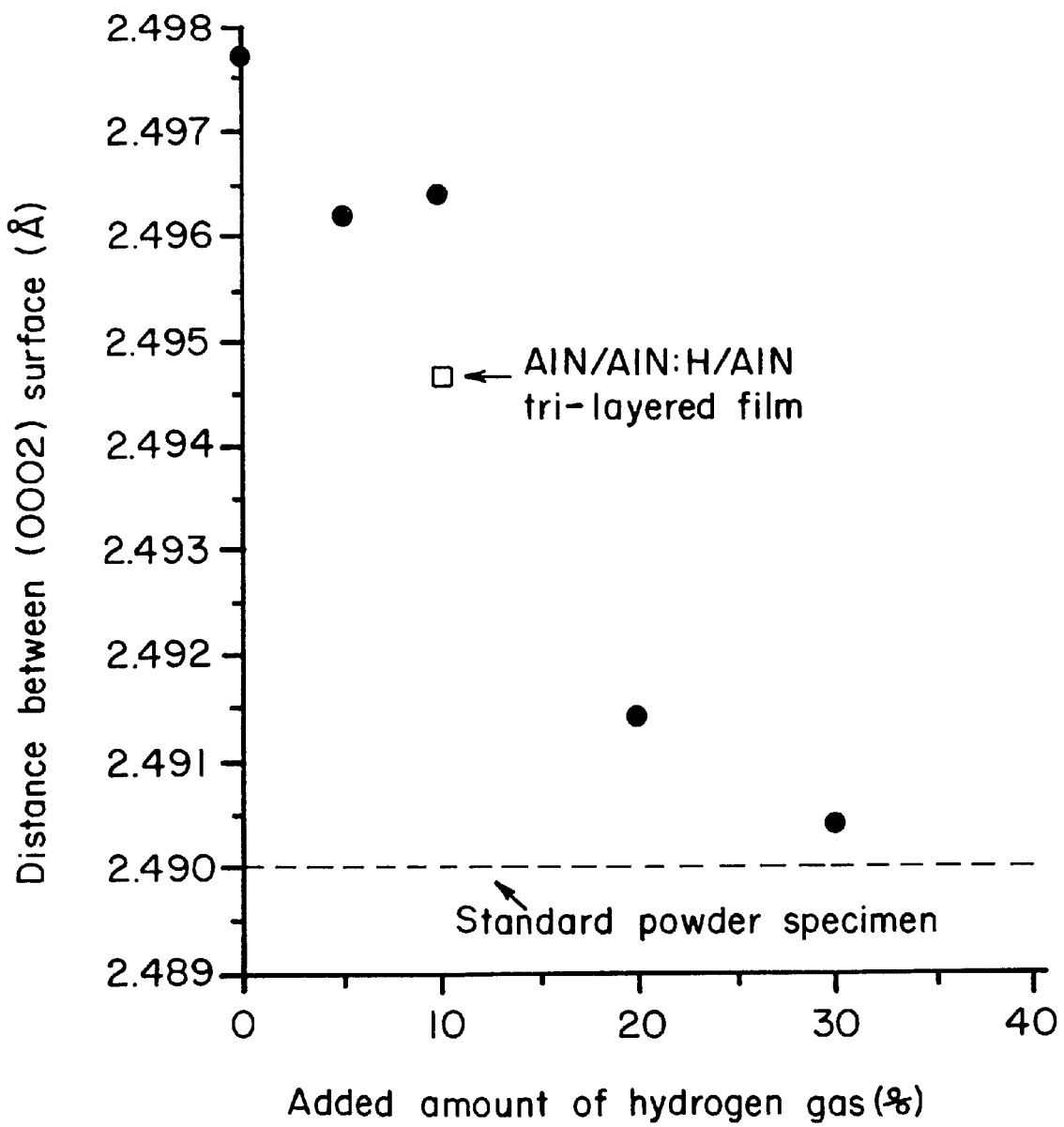
FIG. 2 is a graph showing the distance between (0002) surfaces of AlN:H film depending on the added amount of hydrogen gas.

FIG. 2 is a graph showing the distance between (0002) surfaces of AlN:H film depending on the added amount of hydrogen gas, which is determined by X-ray diffractometer for measuring the stress of AlN film. Since the surface (0002) of AlN film was maintained in parallel with the substrate surface, long distance between surfaces of the film than that of the standard powder specimen means the increase of the suppression stress. As shown in FIG. 2, as the added amount of hydrogen increases, the distance between surfaces becomes shortened and the suppression stress decreases, which permits the increase of the adhesiveness.

EXAMPLE 2: Fabrication of AlN/AlN:H/AlN film

Since the blistering phenomenon occurred at the interface of film and substrate on the exposure of the AlN:H to the atmosphere, both sides of the AlN film(the film surface and the interface of the film and substrate), which was deposited by the addition of 10% hydrogen to the reaction gas, were deposited with AlN film to have a thickness of about 1,000 Å, to give AlN/AlN:H/AlN tri-layered film. As a result, the blistering phenomenon was completely aired and, moreover, the distance between surfaces of the tri-layered film was more shortened than that of AlN film deposited under a reaction gas containing 10% hydrogen, which permits more decrease of the suppression stress of the tri-layered film(see: FIG. 2). In FIG. 2, (□) represents a distance between surfaces of AlN/AlN:H/AlN tri-layered film.

Figure 3:
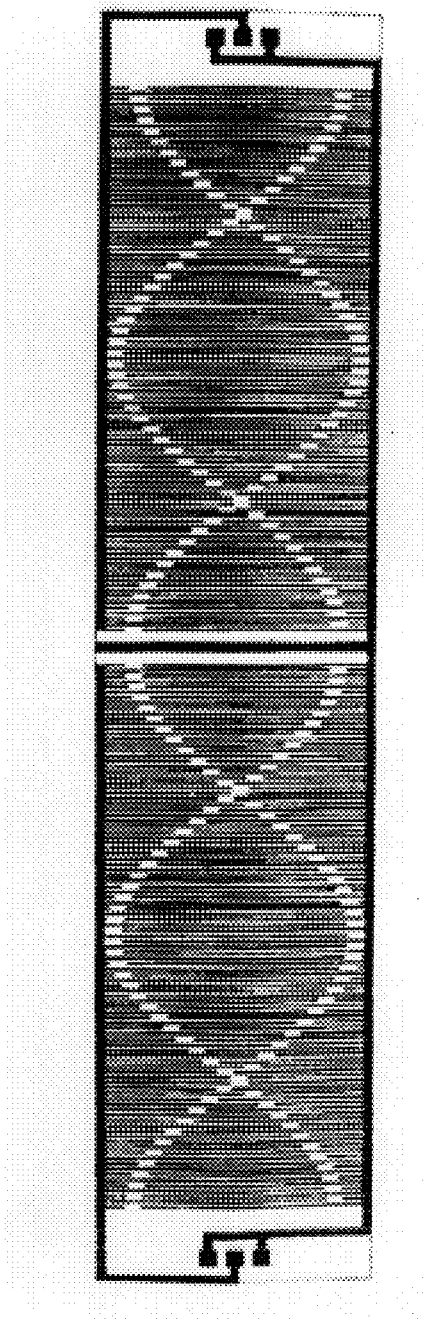
FIG. 3 depicts a surface acoustic wave filter of the present invention.

FIG. 3 depicts a SAW filter of the invention having a wavelength of 60 μm and an electrode width and distance of 15 μm, which is an amplitude modulation type monoelectrode consisting of 101 electrodes, where apodized weighing was made to increase suppression. An electrode aperture is 1,440 μm, a conversion distance is 180 μm, and an electrode width for shielding a wave transfer to other than the film surface is 60 μm. A film width used as piezo-electric material is 4.77 μm(kH=0.5, k=2π/λ), and an aluminum film width used as electrode is 200 nm.

Figure 4:
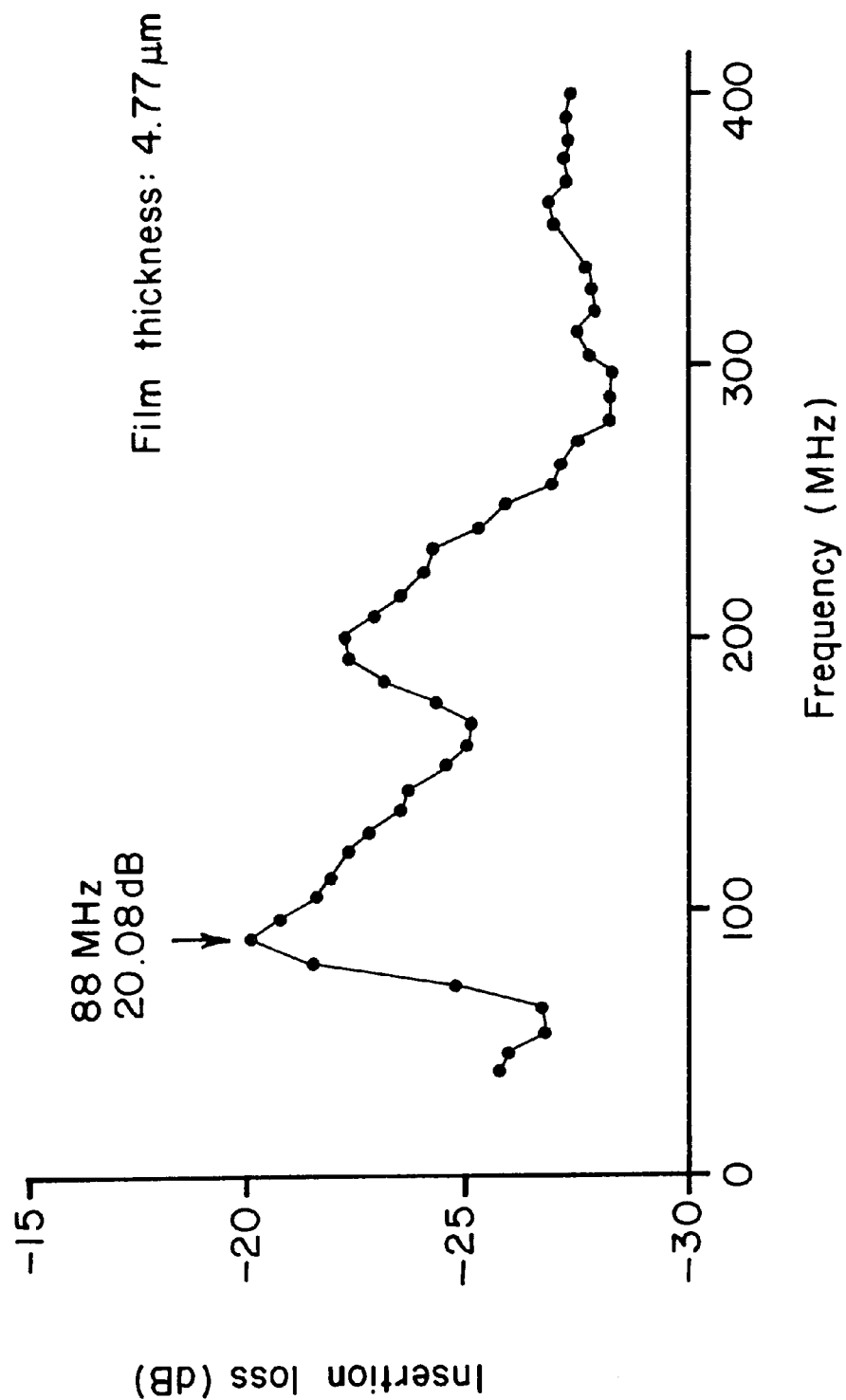
FIG. 4 is a graph showing a frequency response characteristic of a surface acoustic wave filter employing AlN:H/AlN tri-layered film.

FIG. 4 is a graph showing a frequency response characteristic of the SAW filter employing AlN:H/AlN tri-layered film. As shown in FIG. 4, it was determined that the center frequency is 88 MHz and the insertion loss is 20.08 dB. Under a consideration that the SAW wavelength is 60 μm, the propagation velocity of the SAW filter employing the tri-layered film can be calculated to be 5,280 m/s(88 MHz× 60 μm), which is an extremely high.

Figure 5:
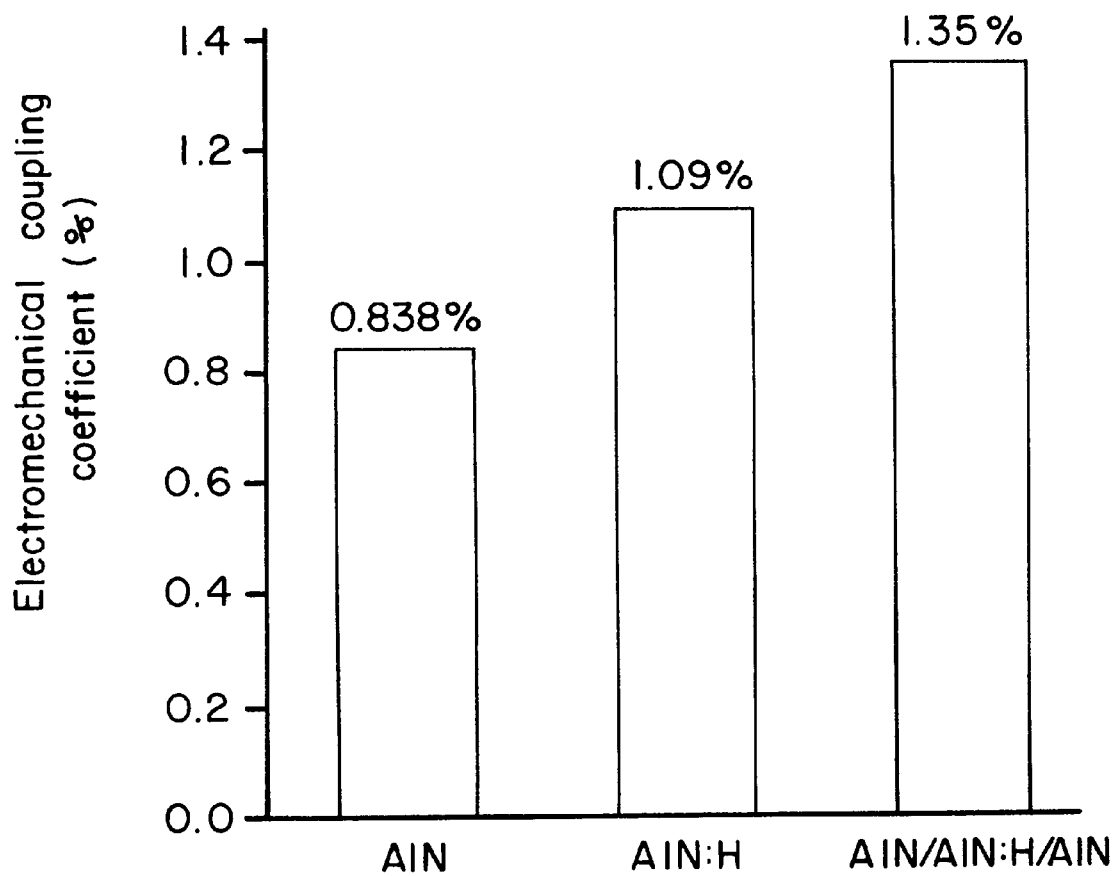
FIG. 5 is a graph showing electromechanical coupling coefficient($k^2$) of surface acoustic wave filters employing AlN film, AlN:H film or AlN/AlN:H/AlN film.

Moreover, FIG. 5 is a graph showing electromechanical coupling coefficient($k^2$) of SAW filters employing AlN film, AlN:H film or AlN/AlN:H/AlN film. In carrying out the experiment, AlN film, AlN:H film added with 10% hydrogen and AlN/AlN:H/AlN tri-layered film having AlN of 1000 Å thickness at both sides to prevent blistering were employed, as a piezoelectric material for the SAW filter, respectively, and the electromechanical coupling coefficient of filter was calculated according to the cross-field model expressed as a delta function(see: A. A. Oliner, "Acoustic Surface Waves", Springer-Verlag(1978)). As shown in FIG. 5, it was clearly demonstrated that the SAW filter employing AlN/AlN:H/AlN tri-layered film has an electromechanical coupling coefficient of 1.35%, which is the highest value.

As clearly illustrated and demonstrated as above, the present invention provides a single process for fabricating a SAW filter having a high SAW propagation velocity and electromechanical coupling coefficient by employing AlN/AlN:H/AlN tri-layered film as a piezo-electric material.

Although the preferred embodiments of the present invention have been disclosed for illustrative purpose, those who are skilled in the art will appreciate that various modifications, additions and substitutions are possible, without departing from the scope and spirit of the invention as disclosed in the accompanying claims.

What is claimed is:

1. A process for fabricating a surface acoustic wave filter employing AlN/AlN:H/AlN comprising sputtering AlN film on both sides of AlN:H film.

2. The process for fabricating a surface acoustic wave filter of claim 1, wherein the AlN:H film is sputtered on a substrate under a reaction gas containing 5 to 30% (v/v) hydrogen gas.

3. The process for fabricating a surface acoustic wave filter of claim 1, wherein the AlN film is sputtered on both sides of the AlN:H film to have a thickness of 100 to 1,000 Å.

4. The process for fabricating a surface acoustic wave filter of claim 2, wherein said substrate is of p-type silicon.

* * * * *